US009025060B2

(12) United States Patent
Nishio et al.

(10) Patent No.: US 9,025,060 B2
(45) Date of Patent: May 5, 2015

(54) SOLID-STATE IMAGE SENSOR HAVING A SHIELDING UNIT FOR SHIELDING SOME OF PHOTO-ELECTRIC CONVERTERS AND IMAGE CAPTURING APPARATUS INCLUDING THE SOLID-STATE IMAGE SENSOR

(75) Inventors: Akihiro Nishio, Yokohama (JP); Ichiro Onuki, Kawasaki (JP); Koichi Fukuda, Tokyo (JP); Ryo Yamasaki, Tokyo (JP); Hideaki Yamamoto, Kawasaki (JP); Makoto Oikawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/428,515

(22) Filed: Mar. 23, 2012

(65) Prior Publication Data
US 2012/0249846 A1    Oct. 4, 2012

(30) Foreign Application Priority Data

Apr. 1, 2011    (JP) .................................. 2011-082189

(51) Int. Cl.
| | | |
|---|---|---|
| H04N 3/14 | (2006.01) |
| H04N 3/12 | (2006.01) |
| H04N 5/225 | (2006.01) |
| H04N 5/232 | (2006.01) |
| H04N 5/238 | (2006.01) |
| H04N 1/46 | (2006.01) |
| G02F 1/1335 | (2006.01) |
| H01L 27/146 | (2006.01) |
| H01L 31/062 | (2012.01) |
| H01L 31/0203 | (2014.01) |
| H04N 5/369 | (2011.01) |

(52) U.S. Cl.
CPC .... *H01L 27/14623* (2013.01); *H01L 27/14603* (2013.01); *H01L 27/14621* (2013.01); *H01L 27/14627* (2013.01); *H04N 5/23212* (2013.01); *H04N 5/3696* (2013.01)

(58) Field of Classification Search
USPC ................. 348/294, 291, 332, 345, 360, 369; 349/95
See application file for complete search history.

(56) References Cited

U.S. PATENT DOCUMENTS

| | | | | |
|---|---|---|---|---|
| 7,358,999 | B2 * | 4/2008 | Ikeda ............................ | 348/349 |
| 8,049,801 | B2 * | 11/2011 | Kusaka ......................... | 348/302 |
| 8,466,998 | B2 * | 6/2013 | Suzuki ......................... | 348/350 |
| 2002/0036257 | A1 * | 3/2002 | Yamashita et al. ......... | 250/208.1 |

(Continued)

FOREIGN PATENT DOCUMENTS

| | | |
|---|---|---|
| JP | 60-125814 | 7/1985 |
| JP | 10-042314 A | 2/1998 |

(Continued)

OTHER PUBLICATIONS

Feb. 23, 2015 Japanese Office Action, issued in Japanese Patent Application No. 2011-082189.

*Primary Examiner* — Timothy J Henn
*Assistant Examiner* — Quan Pham
(74) *Attorney, Agent, or Firm* — Cowan, Liebowitz & Latman, P.C.

(57) ABSTRACT

A solid-state image sensor which comprises a pixel group in which unit pixels each including a microlens and a plurality of photo-electric converters are arrayed two-dimensionally, wherein a shielding unit that shields part of all of a plurality of photo-electric converters corresponding to a single microlens is provided in a portion of the unit pixels.

9 Claims, 14 Drawing Sheets

(56) References Cited

U.S. PATENT DOCUMENTS

| | | | |
|---|---|---|---|
| 2007/0086671 A1* | 4/2007 | Kaji | 382/260 |
| 2009/0309999 A1* | 12/2009 | Hirai et al. | 348/241 |
| 2010/0067757 A1* | 3/2010 | Arai et al. | 382/128 |
| 2010/0188532 A1* | 7/2010 | Kusaka et al. | 348/240.99 |
| 2010/0245656 A1* | 9/2010 | Fujii et al. | 348/345 |
| 2011/0019028 A1* | 1/2011 | Kimijima et al. | 348/222.1 |

FOREIGN PATENT DOCUMENTS

| | | |
|---|---|---|
| JP | 2007-065330 A | 3/2007 |
| JP | 2007-158109 | 6/2007 |
| JP | 2009-017152 A | 1/2009 |
| JP | 2009-244862 | 10/2009 |
| JP | 2010-066494 A | 3/2010 |
| JP | 2010-237401 A | 10/2010 |

* cited by examiner

PIXEL A

PIXEL B

PIXEL A

PIXEL B

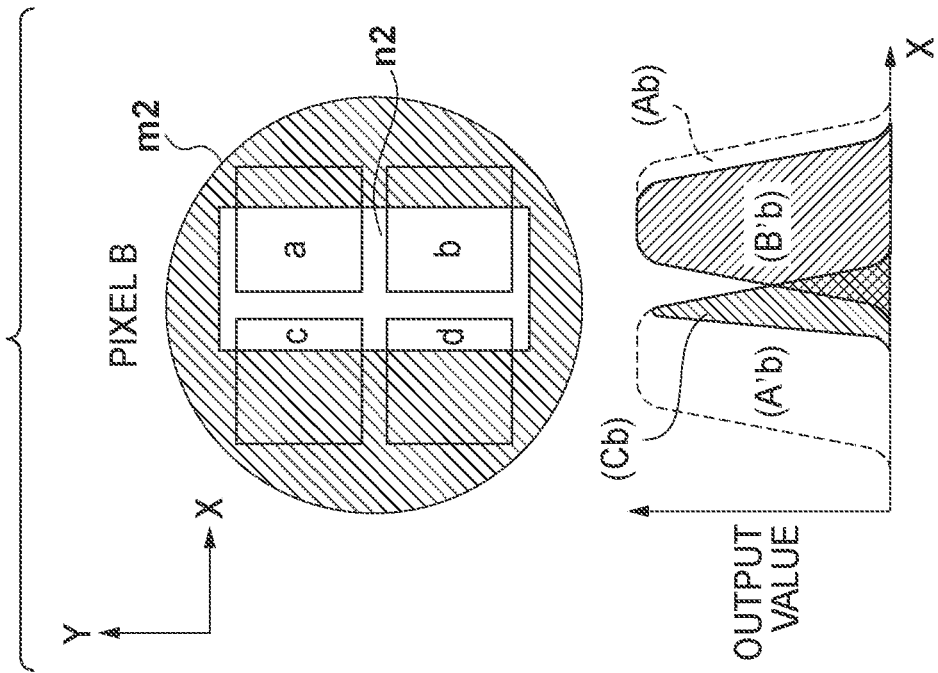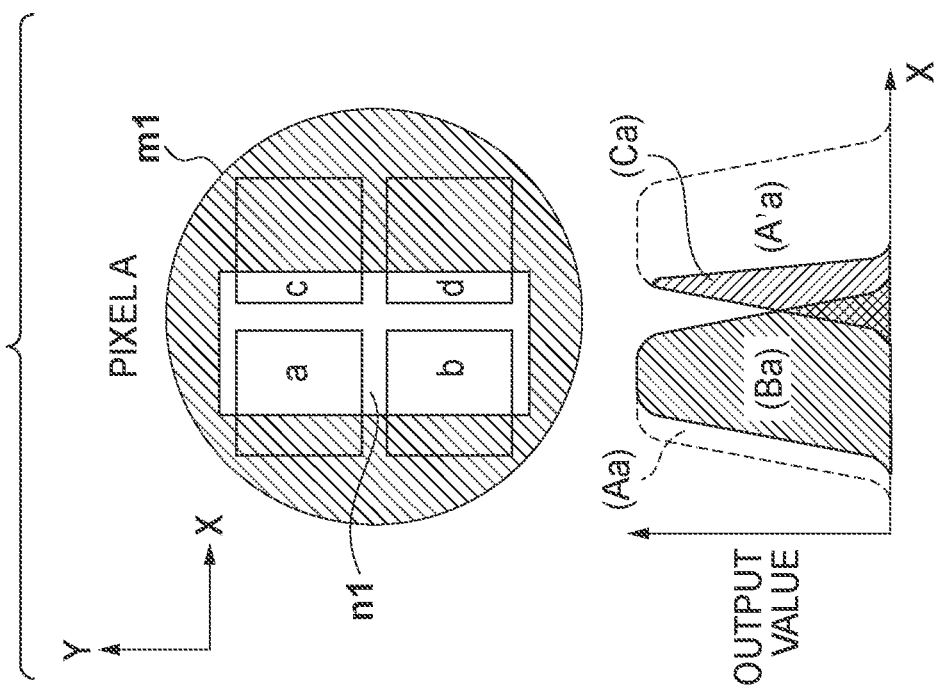

PIXEL A

PIXEL B

PIXEL A

PIXEL B

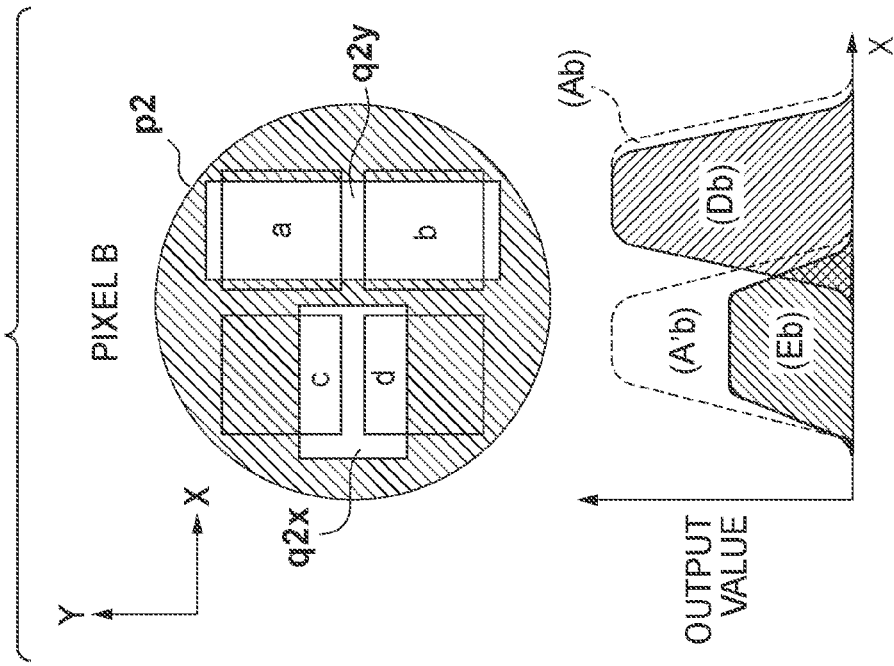
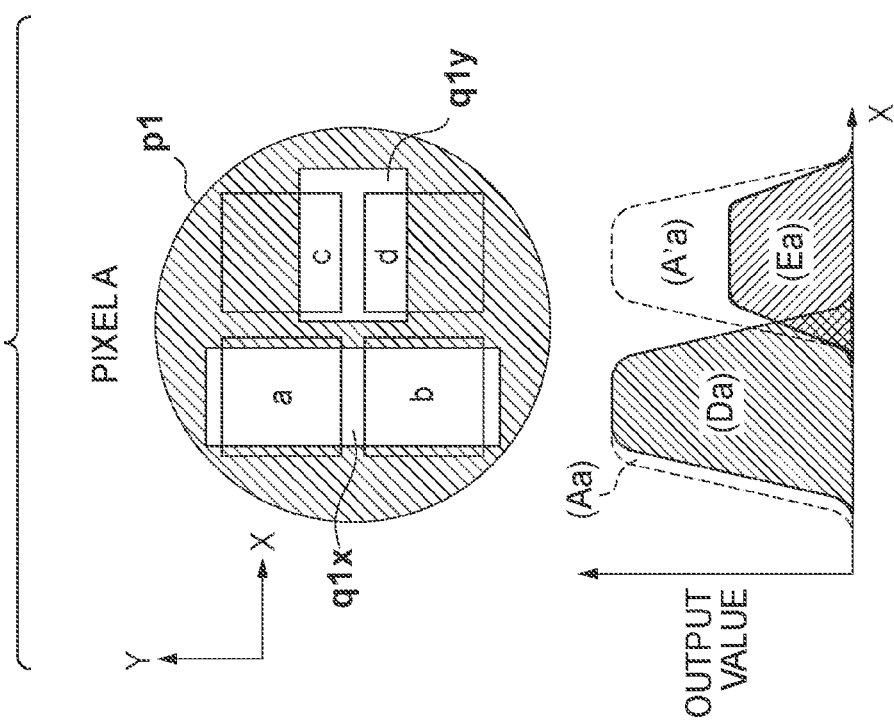

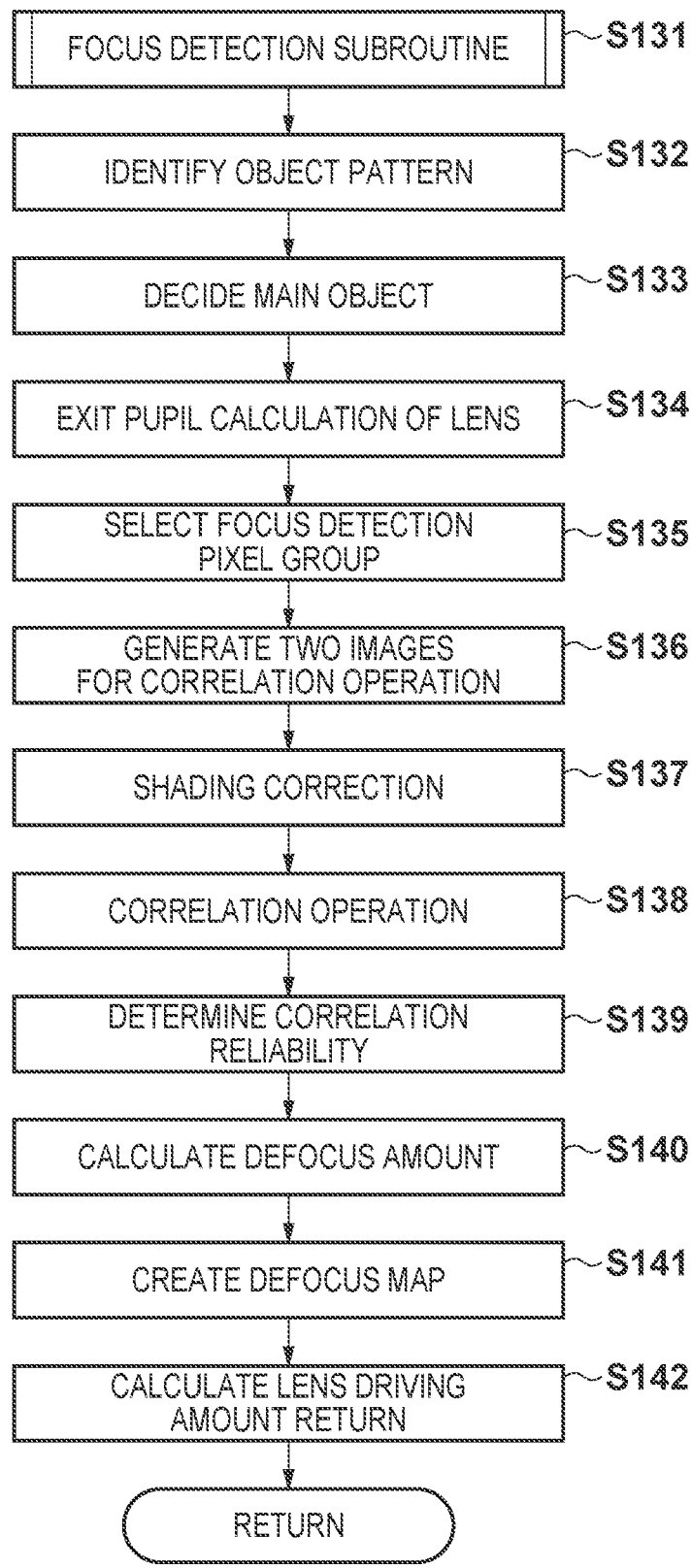

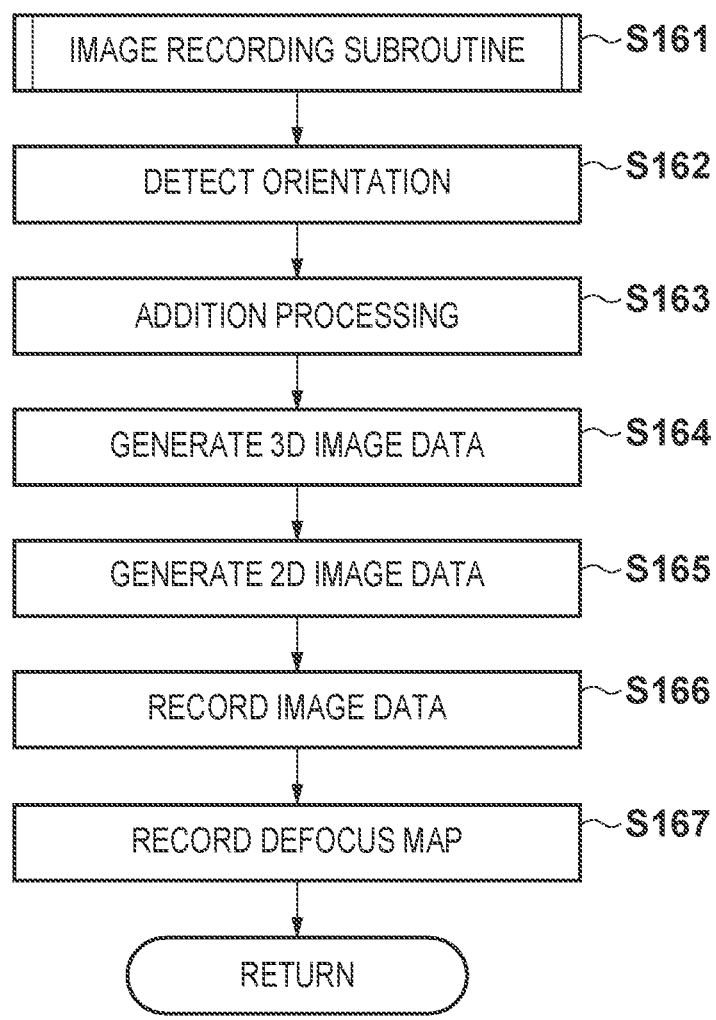

SOLID-STATE IMAGE SENSOR HAVING A SHIELDING UNIT FOR SHIELDING SOME OF PHOTO-ELECTRIC CONVERTERS AND IMAGE CAPTURING APPARATUS INCLUDING THE SOLID-STATE IMAGE SENSOR

BACKGROUND OF THE INVENTION

1. Field of the Invention

The present invention relates to a solid-state image sensor and an image capturing apparatus.

2. Description of the Related Art

Recently, downsized image capturing equipment including special effects and functions with a simple configuration have been available. Image-capturing equipment capable of readily acquiring parallax information to serve as the basis of the three-dimensional image of an object space can be given as an example. Also, in order to quickly and accurately perform focus adjustment of the imaging optical system of image capturing equipment, more accurate detection of the object distance based on parallax information for acquiring three-dimensional information is desired.

As such a technique for quickly and accurately performing focus detection, Japanese Patent Laid-Open No. 60-125814 discloses a configuration in which a focus detection means employing the phase-difference detection method is combined with a focus detection mechanism. Also, as an example of the configuration that does not employ a dedicate unit for focus detection, Japanese Patent Laid-Open No. 2007-158109 discloses a technique in which a portion of image sensing pixels of the solid-state image sensor are used as focus detecting pixels in the phase-difference system.

However, the technique disclosed in Japanese Patent Laid-Open No. 60-125814 requires a dedicated unit for focus detection, and when performing focus detection, the whole or part of light incident on the solid-state image sensor needs to be received. Also, the technique of Japanese Patent Laid-Open No. 2007-158109 employs a complex electrical configuration in order to differentiate a portion of the array of a solid-state image sensor, and the image sensing pixels are used as the focus detecting pixels without changing the configuration thereof. Thus, accurate focus detection cannot be performed.

SUMMARY OF THE INVENTION

The present invention has been made in consideration of the aforementioned problems, and realized a solid-state image sensor and an image capturing apparatus capable of laying out image sensing pixels and focus detecting pixels without employing a complex electrical configuration.

In order to solve the aforementioned problems, the present invention provides a solid-state image sensor which comprises a pixel group in which unit pixels each including a microlens and a plurality of photo-electric converters are arrayed two-dimensionally, wherein a shielding unit that shields part of all of a plurality of photo-electric converters corresponding to a single microlens is provided in a portion of the unit pixels.

In order to solve the aforementioned problems, the present invention provides an image capturing apparatus, comprising: the solid-state image sensor defined above; a focus detection unit configured to perform focus detection using signals from the unit pixels; and a control unit configured to control an optical system to achieve an in-focus state according to a result of the detection by the focus detection unit.

According to the present invention, a solid-state image sensor and an image capturing apparatus capable of laying out image sensing pixels and focus detecting pixels without employing a complex electrical configuration.

Further features of the present invention will become apparent from the following description of exemplary embodiments with reference to the attached drawings.

BRIEF DESCRIPTION OF THE DRAWINGS

FIGS. 5A and 5B are diagrams showing the relation between the incident angle on the pixel and the output value.

FIGS. 9A and 9B are diagrams showing the relation between the incident angle on the pixel and the output value.

FIG. 15 is a flowchart illustrating the focus detection processing performed in step S131 in FIG. 14.

FIG. 16 is a flowchart illustrating image recording processing performed in step S161 in FIG. 14.

DESCRIPTION OF THE EMBODIMENTS

Embodiments of the present invention will be described in detail below. The following embodiments are merely examples for practicing the present invention. The embodiments should be properly modified or changed depending on various conditions and the structure of an apparatus to which the present invention is applied. The present invention should not be limited to the following embodiments. Also, parts of the embodiments to be described later may be properly combined.

A solid-state image sensor and an image capturing apparatus of the present invention are useful for, in particular, digital video cameras and digital still cameras (hereinafter referred to as "cameras"), and include a pixel group including a plurality of pixels, in which a plurality of photoelectric conversion elements covered by a single microlens are taken as a unit pixel. Then, the solid-state image sensor and the image capturing apparatus are configured to acquire parallax information for generating a three-dimensional image using the difference in the light-receiving angles of these photoelectric conversion elements and distance information over the entire object region, and also to acquire precise range information for focus adjustment of a focus lens.

Configuration of Camera

Figure 1:
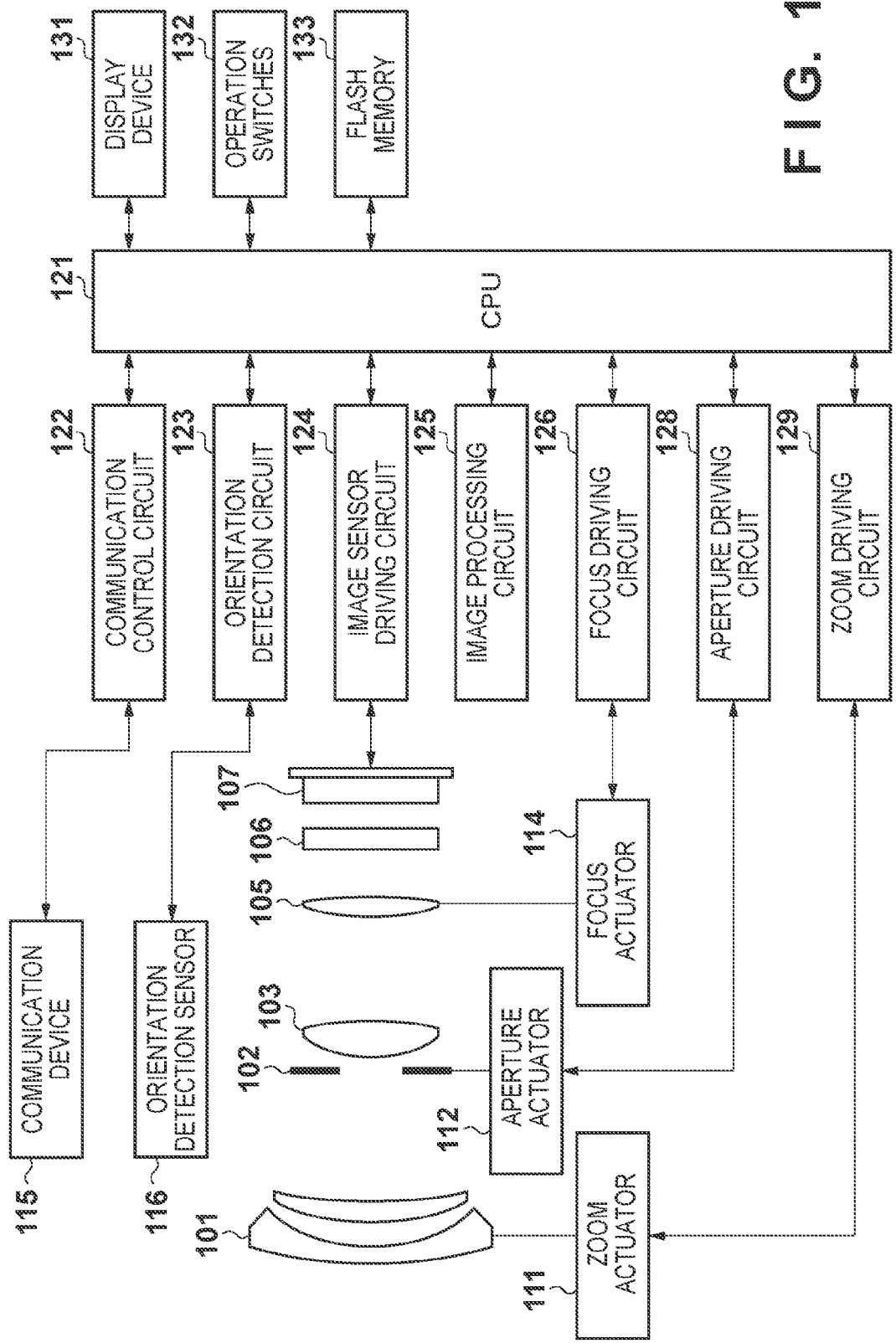
FIG. 1 is a block configuration diagram of an electronic camera according to an embodiment of the present invention.

Firstly, referring to FIG. 1, a configuration of a camera to which a solid-state image sensor and an image capturing apparatus of the present invention have been applied is described. In the camera of the present embodiment, a camera body including a solid-state image sensor and an imaging optical system are formed as a single unit, and recording of moving and still images is possible.

In FIG. 1, reference numeral 101 indicates a first lens group that is disposed at a tip of an imaging optical system (an image forming optical system), which is held so as to be capable of moving in the direction of an optical axis. Reference numeral 102 indicates an aperture, which is used to adjust light quantity during image-capturing by the opening area thereof being adjusted, and which also functions as an exposure time adjustment shutter when capturing still images. Reference numeral 103 indicates a second lens group. The aperture 102 and the second lens group 103 are integrally driven in the direction of the optical axis, thereby realizing a variable power effect (zoom function) by operating in tandem with the first lens group 101.

Reference numeral 105 indicates a third lens group, which performs focus adjustment by moving in the direction of the optical axis. Reference numeral 106 indicates an optical low-pass filter, which is an optical element for reducing a false color or moiré in a captured image. Reference numeral 107 indicates a solid-state image sensor configured of a CMOS sensor and peripheral circuitry thereof. A two-dimensional single-chip color sensor which is configured of a rectangular pixel group of unit pixels arranged two-dimensionally, with m pixels in the horizontal direction and n pixels in the vertical direction, and in which a Bayer-pattern primary color mosaic filter is formed on the chip is used for the solid-state image sensor 107.

Reference numeral 111 indicates a zoom actuator, which drives the first lens group 101 to the third lens group 103 in the direction of the optical axis by rotating a cam tube (not shown) manually or using an actuator, thereby realizing the zoom function. Reference numeral 112 indicates an aperture actuator, which controls the opening area of the aperture 102 to adjust the light quantity for image capturing and also controls the exposure time when capturing still images. Reference numeral 114 indicates a focus actuator, which drives the third lens group 105 in the direction of the optical axis, thereby performing focus adjustment.

Reference numeral 115 indicates a wireless or wired communication device, which is configured of an antenna for communicating with a server computer through a network line such as the Internet, a signal processing circuit, and the like. Reference numeral 116 indicates a camera orientation detection sensor, and an electronic level for distinguishing the image-capturing orientation of the camera, that is, distinguishing whether an image is captured in the landscape position or the portrait position, is used.

Reference numeral 121 indicates a CPU, which includes an arithmetic unit, a ROM, a RAM, an A/D converter, a D/A converter, a communication interface circuit, and the like in order to govern various types of control of the camera body, and based on predetermined programs stored in the ROM, drives various types of circuitry included in the camera to execute a series of operations including auto-focusing (AF), image capturing, image processing, and recording.

Reference numeral 122 indicates a communication control circuit, which transmits captured image data from the camera to a server computer via the communication device 115, and receives image data or various types of information from the server computer, for example. Reference numeral 123 indicates an orientation detection circuit, which discriminates the orientation of the camera based on the signal output from the orientation detection sensor 116. Reference numeral 124 indicates an image sensor driving circuit, which controls the imaging operation performed by the solid-state image sensor 107, converts an analog image signal acquired from the solid-state image sensor 107 into a digital signal, and outputs the converted signal to the CPU 121. Reference numeral 125 indicates an image processing circuit, which performs processing such as gamma conversion, color interpolation, and image compression on an image signal acquired from the solid-state image sensor 107, thereby generating digital image data.

Reference numeral 126 indicates a focus driving circuit, which drives the focus actuator 114 based on the result of focus detection to be described later and performs focus adjustment by driving the third lens group 105 in the direction of the optical axis. Reference numeral 128 indicates an aperture driving circuit, which drives the aperture actuator 112, thereby controlling the opening area of the aperture 102. Reference numeral 129 indicates a zoom driving circuit, which drives the zoom actuator 111 in accordance with zoom operation via an operation switch 132 performed by an image capturer.

Reference numeral 131 indicates a display device such as an LCD, which displays information regarding the shooting mode of the camera, a preview image during image capturing and a confirmation image after image capturing, an image indicating the in-focus state during focus detection, orientation information of the camera, and the like. Reference numeral 132 indicates a group of operation switches, which includes a power switch, a shooting trigger switch, a zoom operation switch, a shooting mode selection switch, and the like. Reference numeral 133 indicates a flash memory removable from the camera body, which records data of captured images.

First Embodiment

Next, referring to FIG. 2, the pixel structure of a solid-state image sensor of the first embodiment will be described.

Figure 2:
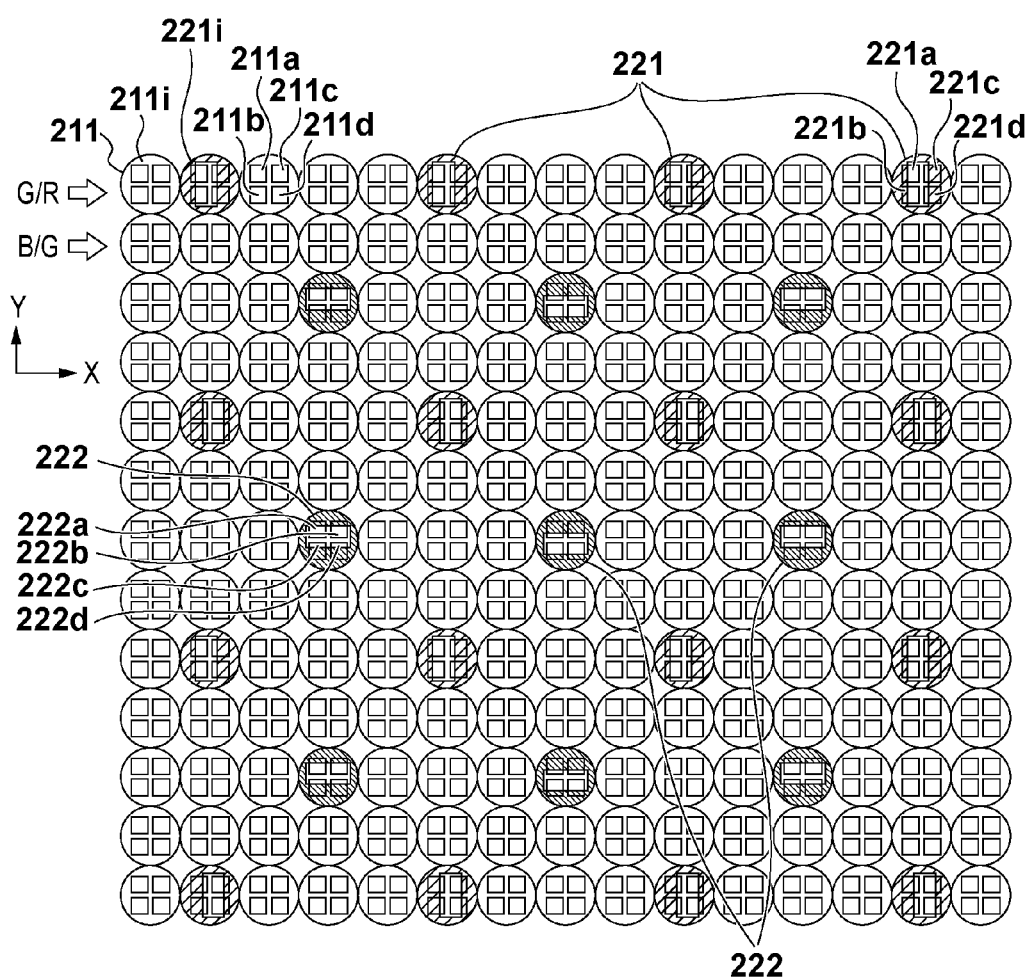
FIG. 2 is a diagram showing a pixel array of a solid-state image sensor of the first embodiment.

FIG. 2 illustrates a state of the range formed by 13 rows in the vertical direction (Y direction) and 15 columns in the horizontal direction (X direction) of a two-dimensional CMOS area sensor viewed from the imaging optical system. Bayer pattern is applied to the color filter, in which a green color filter and a red color filter are provided alternately from the left for the pixels of odd-numbered rows. Also, for the pixels of even-numbered rows, a blue color filter and a green color filter are provided alternately from the left. Circles indicated by 211$i$, 221$i$, and the like indicate on-chip microlens. A plurality of rectangles disposed inside the on-chip microlens each indicate a photo-electric converter.

Also, the portions hatched in black in the diagrams indicate shielded portions in the unit pixels.

In the description provided below, the shape realized by connecting the photo-electric converters in a unit pixel is referred to as a connected shape, and the center of the connected shape is referred to as a connection center.

Reference numeral 211 indicates a first pixel, which includes a total of four photo-electric converters 211$a$ to 211$d$ arranged in a two by two grid, aligned in the X direction and the Y direction. These photo-electric converters 211$a$ to 211$d$ are separately arranged so as to be axis symmetrical with respect to an X axis and a Y axis that are perpendicular to each other intersecting at the pixel center. That is, each separated region of a converter has a square planar shape, the connected shape formed by combining the four regions is also square, and the shape is the same in any position on the image surface. The output signal subjected to photoelectric conversion by the first pixel 211 is used for image data generation and for focus detection in the vicinity of the focal position. Here, the image data includes three-dimensional image data configured of a plurality of image data pieces including parallax information in addition to ordinary two-dimensional image data in the JPEG format or the like, and including both video data and still image data.

A second pixel 221 and a third pixel 222 have the same configuration as the first pixel 211 except that they are each provided with one of a first shielding unit m1 to a fourth shielding unit m4 to be described below.

The second and third pixels 221 and 222 detect object images in directions perpendicular to each other (vertical stripe pattern and horizontal stripe pattern), and in the pixel array shown in FIG. 2, the second pixel 221 and the third pixel 222 detect an object image in the horizontal direction and in the vertical direction, respectively.

FIGS. 3A and 3B and FIGS. 4A and 4B are enlarged views of the second and third pixels 221 and 222, and four photoelectric converters in each unit pixel are indicated by alphabetical letters a to d.

The second and third pixels 221 and 222 are provided with four types of shielding units, namely, first to fourth shielding units m1 to m4 including different-shaped openings, each opening spanning the four photo-electric converters a to d. First to fourth openings n1 to n4 having different shapes are respectively formed in the first to fourth shielding units m1 to m4, the opening of each pixel spanning part of all of the four photo-electric converters a to d. Then, among the first to fourth shielding units m1 to m4, the first opening n1 of the first shielding unit m1 is formed so as to be axis symmetrical with respect to the X axis and the second opening n2 of the second shielding unit m2 is formed so as to be axis symmetrical with respect to the X axis, and the third opening n3 of the third shielding unit m3 is formed so as to be axis symmetrical with respect to the Y axis and the fourth opening n4 of the fourth shielding unit m4 is formed so as to be axis symmetrical with respect to the Y axis, the X and Y axes being perpendicular to each other intersecting at the pixel center (see FIGS. 3A and 3B and FIGS. 4A and 4B).

With respect to the second and third pixels 221 and 222, methods of adding the signals output from the four photo-electric converters a to d are classified as described below.

Figure 3A:
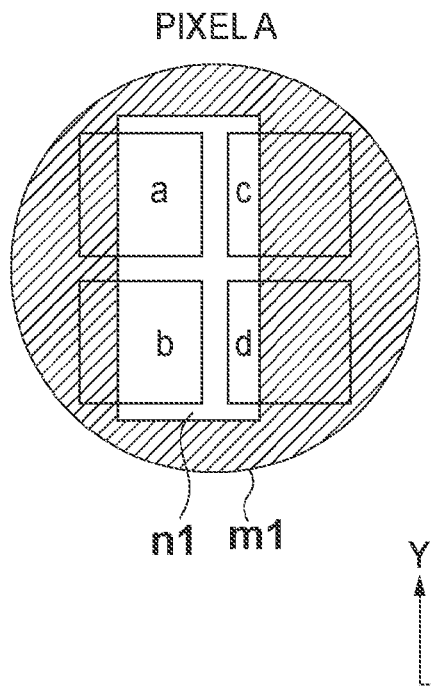
FIGS. 3A and 3B are detailed diagrams of focus detecting pixels for vertical stripe detection of the first embodiment.
Figure 3B:
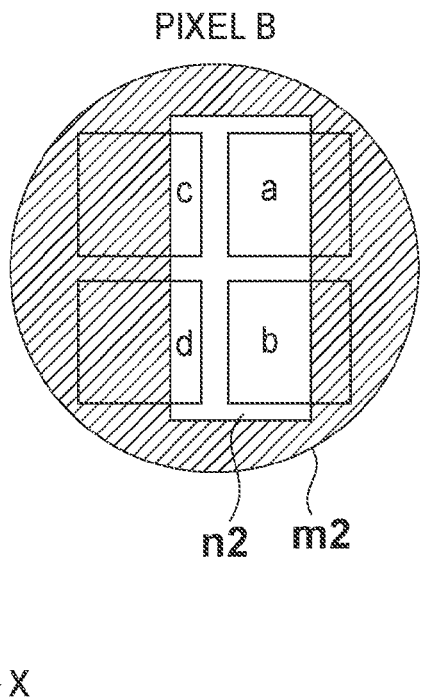
Figure 4A:
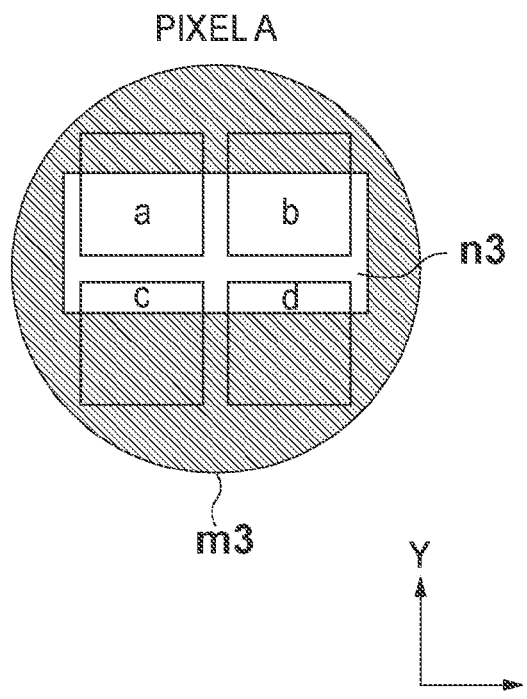
FIGS. 4A and 4B are detailed diagrams of focus detecting pixels for horizontal stripe detection of the first embodiment.
Figure 4B:
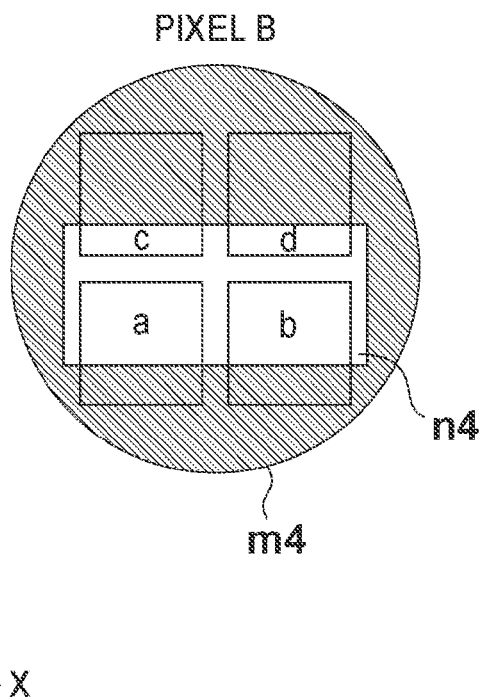

(i) Add signals of the photo-electric converters a to d
(ii) Add signals of the photo-electric converters a and b
(iii) Add signals of the photo-electric converters c and d FIGS. 5A and 5B indicate pixels in which the shielding units m1 and m2 shown in FIGS. 3A and 3B are provided.

In the present embodiment, focus detection is performed using a pair of partially shielded pixels such as the pixel A and the pixel B shown in the drawings, based on the relation of the output values of the pixels.

In the graphs of FIGS. 5A and 5B, the horizontal axis indicates the angle of the light beam emitted from the entrance pupil of the imaging optical system toward the pixel A and the pixel B, and the vertical axis indicates change in the photoelectric conversion intensity corresponding thereto, when capturing the image of an object having a uniform luminance, which is generally called pupil intensity distribution.

In the description given below, the pixel A will be described. Since the shape of the shielding unit (opening) of the pixel B is obtained by mirroring that of the pixel A in the right-to-left direction (here, in the X axis direction), the pupil intensity distributions of the pixels A and B also show characteristics mirrored in the right-to-left direction. Also, with respect to the shielding units m3 and m4 shown in FIGS. 4A and 4B, although their pupil intensities are different from those shown in FIGS. 5A and 5B, their pupil intensity distributions show characteristics mirrored in the right-to-left direction.

The portions (Aa) and (A'a) indicated by the dotted lines in the pupil intensity distribution graphs in FIGS. 5A and 5B represent the pupil intensity distributions of the output value from the first pixel 211 that does not include the shielding unit in the above-described methods (ii) and (iii), respectively. In the case of use for imaging of ordinary two-dimensional image data, the signals from the photo-electric converters a to d are added to realize the function as a single pixel.

Also, in the state where the shielding unit is provided, the portion (Ba) represents the pupil intensity distribution in the above-described method (ii) and the portion (Ca) represents the pupil intensity distribution in the above-described method (iii). In FIGS. 5A and 5B, overlapping pupil intensity distribution regions are added together and have double intensity.

In this manner, it is possible to realize an effect of seemingly changing the short side length of the shielding unit (slit width) by changing the method of adding the output signals from the photo-electric converters.

Second Embodiment

Next, referring to FIG. 6, a pixel configuration of a solid-state image sensor of the second embodiment will be described. Note that in the second embodiment, the configuration and arrangement of color filters, pixels and photo-electric converters as well as the method of using signals output from the pixels are the same as those of the first embodiment.

Figure 6:
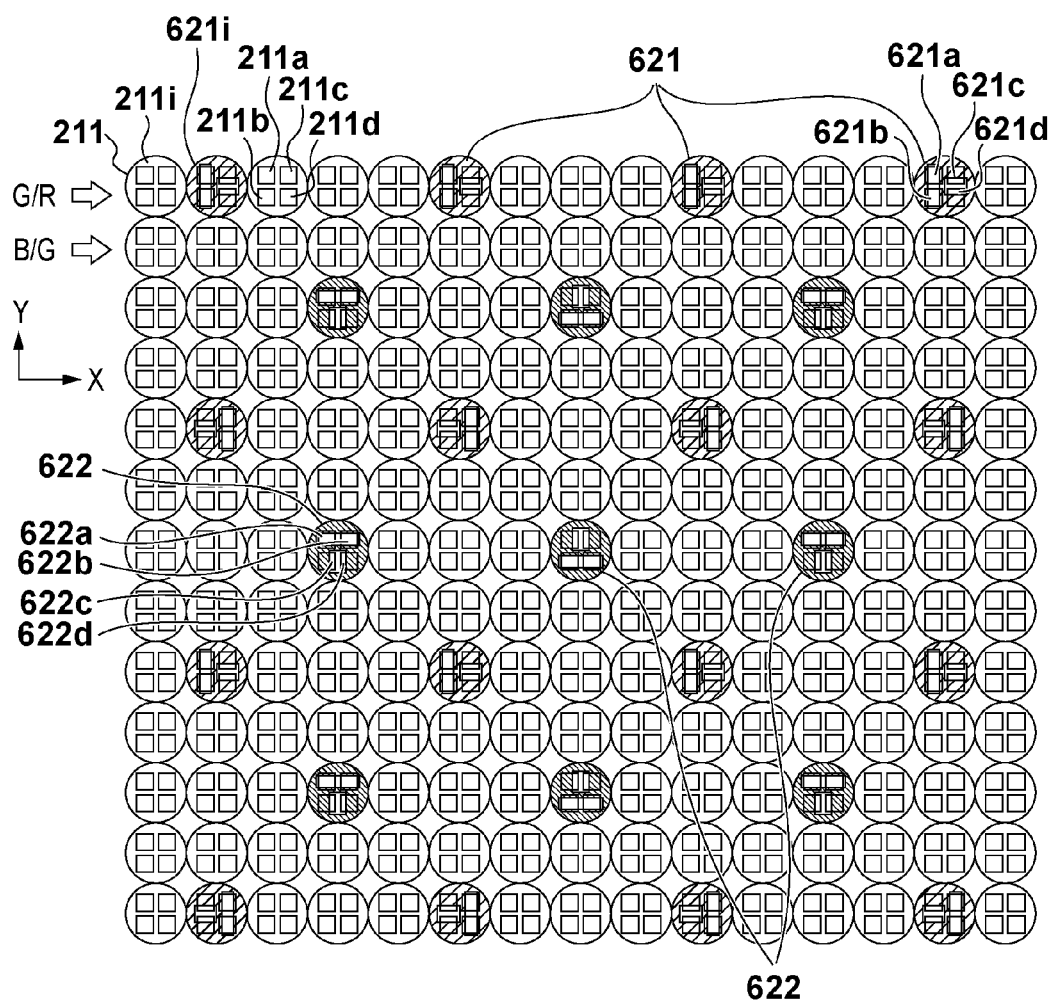
FIG. 6 is a diagram showing a pixel array of a solid-state image sensor of the second embodiment.

The output signals subjected to photoelectric conversion by second and third pixels 621 and 622 shown in FIG. 6 are used for image data generation and for focus detection in the vicinity of the focal position.

Here, the second and third pixels 621 and 622 selectively detect an object image in directions perpendicular to each other (vertical stripe pattern and horizontal stripe pattern), using the method of adding signals of the photo-electric converters to be described later.

FIGS. 7A and 7B and FIGS. 8A and 8B show enlarged views of the second and third pixels 621 and 622, where four photo-electric converters in each unit pixel are respectively indicated by alphabetical letters a to d.

Unlike the first embodiment, the second and third pixels 621 and 622 each include a plurality of openings having different shapes, and four types of shielding units, namely, first to fourth shielding units p1 to p4, each shielding part of all of a plurality of photo-electric converters 621a to 621d of the pixel 621 or part of all of a plurality of photo-electric converters 622a to 622d of the pixel 622 are provided. First openings q1x to q4x and second openings q1y to q4y are provided in the first to fourth shielding units p1 to p4, the first opening and the second opening in the same shielding unit having different shapes, each opening spanning part of all of two adjacent photo-electric converters a and b, or part of all of two adjacent photo-electric converters c and d, among the four photo-electric converters a to d. Among the first to fourth shielding units p1 to p4, the first and second openings q1x and q1*y* of the first shielding unit p1 are formed so as to be axis symmetrical with respect to the X axis, and the first and second openings q2*x* and q2*y* of the second shielding unit p2 are formed so as to be axis symmetrical with respect to the X axis, and the first and second openings q3*x* and q3*y* of the third shielding unit p3 are formed so as to be axis symmetrical with respect to the Y axis, and the first and second openings q4*x* and q4*y* of the fourth shielding unit p4 are formed so as to be axis symmetrical with respect to the Y axis, the X and Y axes perpendicular to each other intersecting at the pixel center (see FIGS. 7A and 7B and FIGS. 8A and 8B).

With respect to the second and third pixels 621 and 622, the method of adding the signals output from the four photo-electric converters a to d are classified as described below.

Figure 7A:
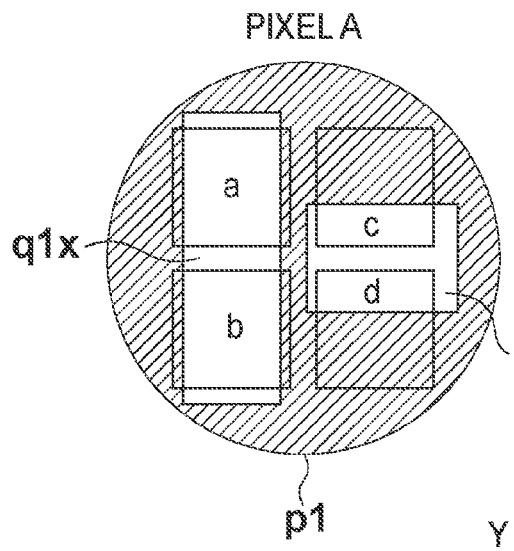
FIGS. 7A and 7B are detailed diagrams of focus detecting pixels according to a first arrangement of the second embodiment.
Figure 7B:
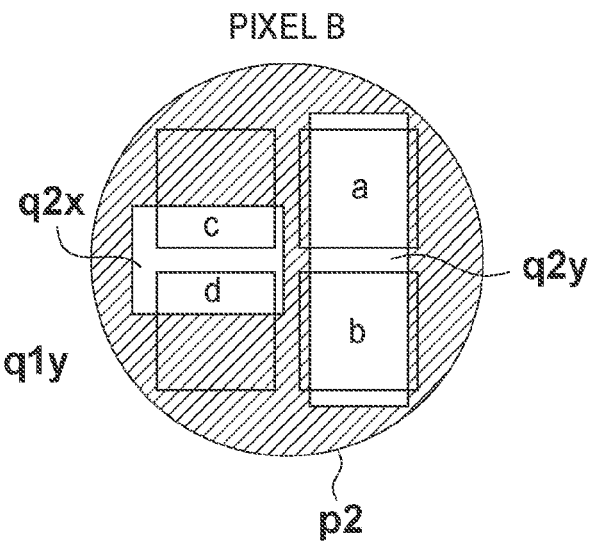
Figure 8A:
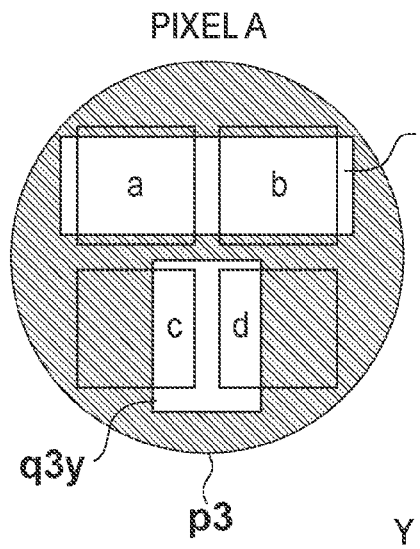
FIGS. 8A and 8B are detailed diagrams of focus detecting pixels according to a second arrangement of the second embodiment.
Figure 8B:
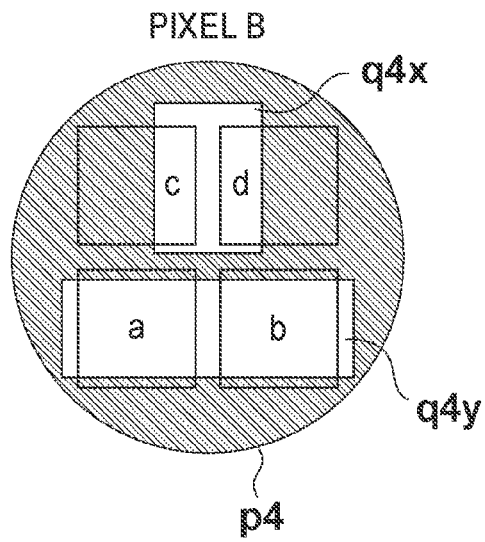

(i) Add signals of the photo-electric converters a to d
(ii) Add signals of the photo-electric converters a and b
(iii) Add signals of the photo-electric converters c and d
(iv) Signal c or d FIGS. 9A and 9B show the pupil intensity distributions of pixels provided with the shielding units p1 and p2 shown in FIGS. 7A and 7B. Although the pixel A will be described below, since the openings of the shielding unit of the pixel B is obtained by mirroring those of the pixel A in the right-to-left direction (here, in the X axis direction), the pupil intensity distributions of the pixels A and B also show characteristics mirrored in the right-to-left direction. Also, with respect to the shielding units p3 and p4 shown in FIGS. 8A and 8B, although their pupil intensities are different from those shown in FIGS. 9A and 9B, their pupil intensity distributions show characteristics mirrored in the right-to-left direction.

Then, focus detection is performed using a pair of partially shielded pixels such as the pixel A and the pixel B shown in the drawings, based on the relation of the output values of the pixels.

The portions (Aa) and (A'a) indicated by the dotted lines in the graphs of the pupil intensity distribution shown in FIGS. 9A and 9B represent the pupil intensity distributions of a pixel that does not include the shielding unit in the above-described method (i).

Also, in the state in which the shielding unit is provided, the portion (Da) represents the pupil intensity distribution in the above-described method (ii), and the portion (Ea) represents the pupil intensity distribution in the above-described method (iii).

Also, in FIGS. 9A and 9B, overlapping pupil intensity distribution regions are added together and have double intensity.

In this manner, it is possible to realize an effect of seemingly changing the long side length and short side length of a shielding unit (slit length and slit width) by changing the method of adding output signals from the shielded photo-electric converters.

Here, why the openings of the shielding units of the second and third pixels 621 and 622 are formed in a slit shape will be described.

In the focus detection in the phase-difference detection method, although pupil division of a focus detection light flux is performed on the exit pupil of the imaging optical system, in the case where the pupil size in the pupil division direction is large, a focus detection image is blurred too much so that the range within which focus detection is possible is narrowed.

Also, when the F number of the imaging optical system corresponds to dark lens (F number is large), vignetting in the focus detection light flux increases and the mutual similarity between a pair of focus detecting signals is reduced, which deteriorates focus detection capability. Furthermore, since the vignetting effect depends on the defocus amount, when the defocus amount is large, the focus detection capability is further deteriorated.

Here, the focus detecting pupil on the surface of the exit pupil of the imaging optical system and the photo-electric converters of each pixel of the solid-state image sensor are in a conjugate relationship due to the on-chip microlens. Thus, by forming the openings of the focus detecting pixels in a slit form and setting the stripe pattern direction of an object to be evaluated to the short side direction of the opening, the pupil size in the pupil division direction for focus detection is reduced, thereby avoiding deterioration of the focus detection capability.

In contrast, in the vicinity of the focal position, that is, in the case of a small defocus amount, even if the size of the focus detecting pupil is large, blurring of the focus detection image is suppressed.

Therefore, in the case where it is judged that an object image that is being captured is in the vicinity of the focal position, the output value obtained by adding all the output signals from the photo-electric converters a, b, c, and d may be used as the focus detection signal.

Furthermore, using the output signal from the first pixel 211 as well for focus detection increases the information amount of the focus detection signal used for focus detection, and the noise effect in the pixel output is suppressed, which further improves focus detection accuracy.

Configuration of Readout Circuit

Figure 10:
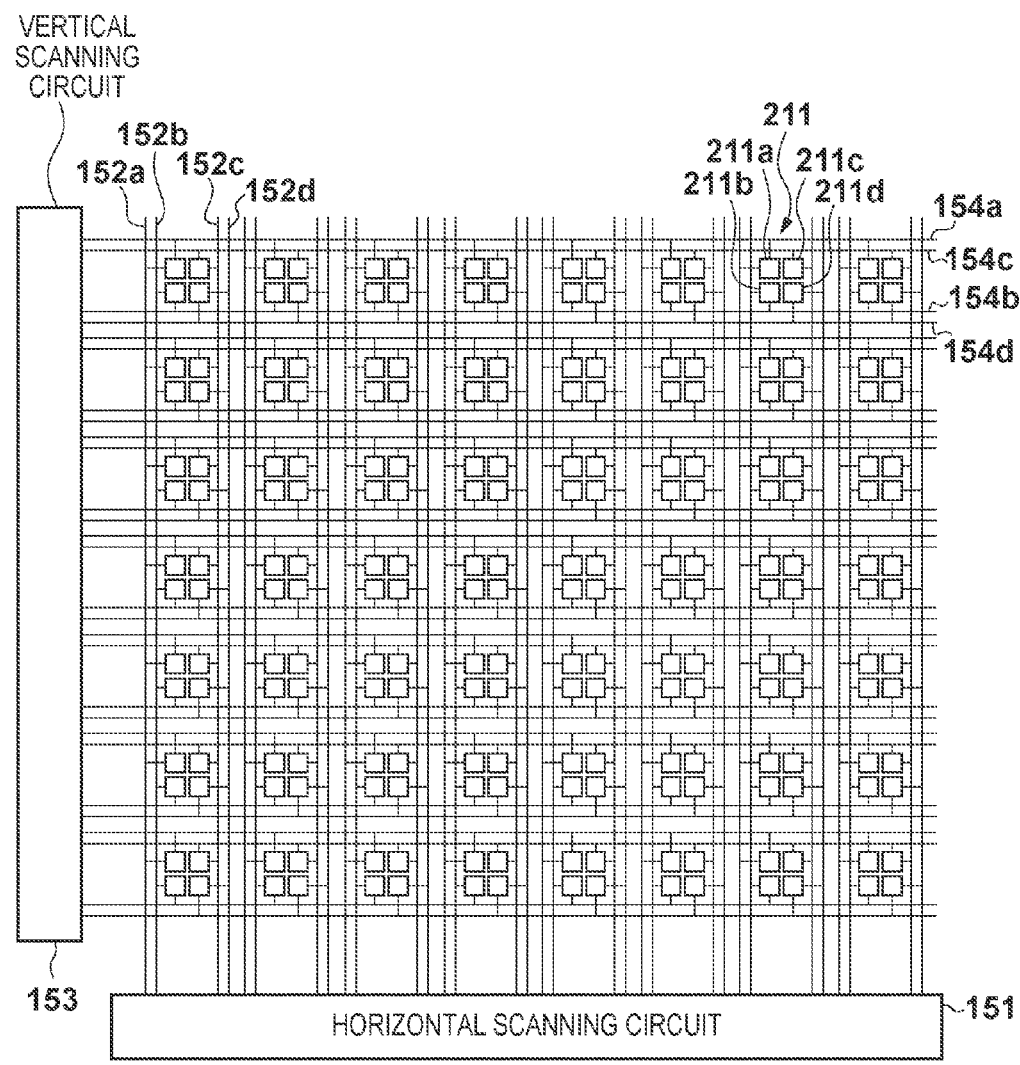
FIG. 10 is a configuration diagram of a readout circuit in the solid-state image sensor according to an embodiment of the present invention.

Next, referring to FIG. 10, the configuration of a readout circuit in the solid-state image sensor of the present embodiment will be described. In FIG. 10, reference numeral 151 indicates a horizontal scanning circuit, and reference numeral 153 is a vertical scanning circuit. Then, horizontal scanning lines 152*a* to 152*d* and vertical scanning lines 154*a* to 154*d* are wired at the boundary portion of each pixel, and image signals are read out from the photo-electric converters of each pixel via the respective scanning lines.

All the above-described pixels each including four photo-electric converters have the same configuration, and thus a complex configuration such as that in which the number of the photo-electric converters differs between the image sensing pixel and the focus detecting pixel is not employed.

Although the wiring configuration shown in FIG. 10 is depicted using lines having the same width in order to make the drawing simple, setting is performed such that a function of the shielding unit is provided by using different line widths within the pixel, as described later.

Note that the solid-state image sensor of the present embodiment includes two types of readout modes, namely, a first readout mode and a second readout mode. The first readout mode is called an all-pixel readout mode, in which signals of all pixels are read out for capturing a high-definition still image.

The second readout mode is called a thinning readout mode, which is for performing only display of a moving image or preview image. Since the number of pixels required for this mode is less than the total number of pixels, the first pixels 211 are thinned at a predetermined ratio both in the X direction and the Y direction and read out. Also, the focus detection function is maintained by reading out all signals from the second and third pixels 221, 222, 621 and 622.

Figure 11:
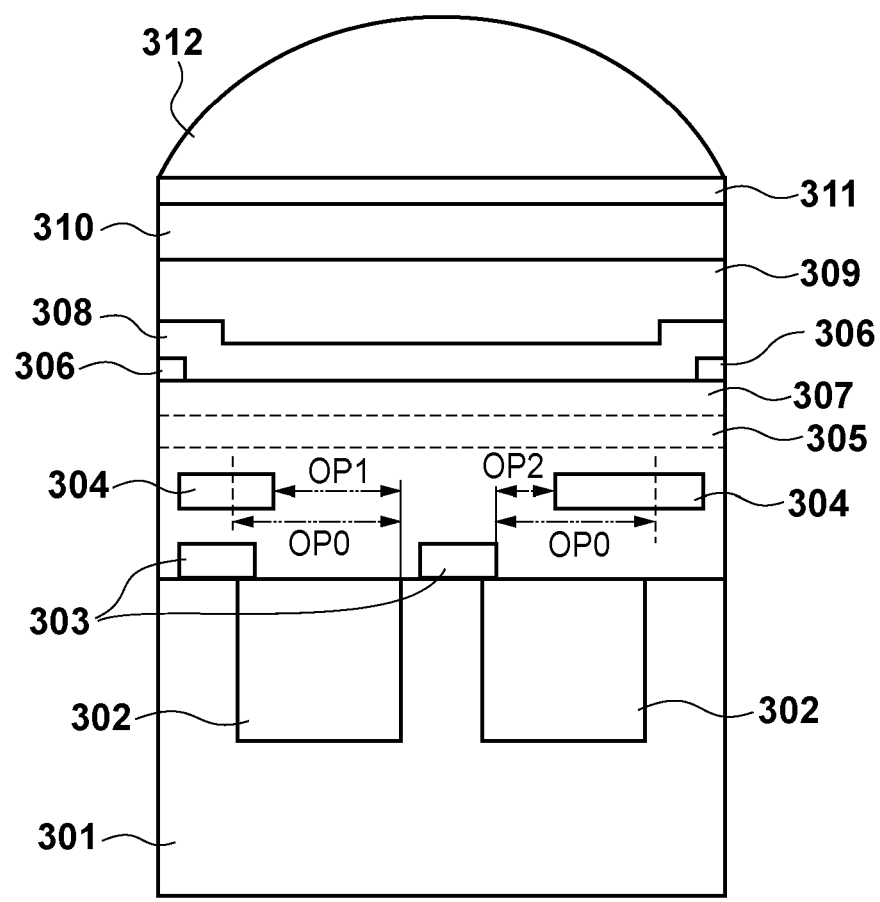
FIG. 11 is a diagram illustrating a cross-sectional structure of a focus detecting pixel.

FIG. 11 schematically shows the cross-sectional configuration of the focus detecting pixel in the pixel group of the present embodiment. Details thereof are as disclosed in Japanese Patent Laid-Open No. 2009-244862, and this known technique is applied to the present embodiment.

In FIG. 11, photo-electric converters 302 are embedded in a silicon substrate 301. Transparent polysilicon electrodes 303 are provided on the top surfaces of the photo-electric converters 302 and the silicon substrate 301.

Each of first to third electrode groups 304 to 306 in a multi-layer structure is provided above the transparent polysilicon electrodes 303. The third electrode group 306 is arranged in the boundary portion of each pixel. These electrode groups 304 to 306 in three layers are formed by etching a metal film made of aluminum, copper or the like.

Also, the first to third electrode groups 304 to 306 are insulated by a transparent inter-layer insulation film 307 made of silicon dioxide ($S_iO_2$) or the like. Reference numeral 308 indicates a passivation film that covers the top of the third electrode group 306, and reference numeral 309 indicates a first flat layer. Reference numeral 310 indicates a color filter. Reference numeral 311 indicates a second flat layer, and reference numeral 312 is a microlens.

The image sensing pixel and the focus detecting pixel differ from each other in terms of the shapes of the first electrode group 304 and the second electrode group 305 in the pixels.

Taking an insulation region between electrodes adjacent to each other into consideration, a layout is realized such that the first and second electrode groups 304 and 305 have widths with which widths OP1 and OP2 are achieved as shown in FIG. 11, with respect to a width OP0 of the image sensing pixel, so as to form a slit-shaped opening in the focus detecting pixel.

In this manner, in the present embodiment, the first and second electrode groups 304 and 305 are used as shielding films to provide the pixel with a pupil division function, thereby forming the focus detecting pixel.

On the other hand, the layout of the image sensing pixel is realized such that the first and second electrode groups 304 and 305 have lengths indicated by the dotted lines, and sufficient light is guided to the photo-electric converters through opening regions indicated by OP0 in FIG. 11.

Note that although FIG. 11 indicates the cross section viewed from only one direction, with respect to the direction perpendicular to the cross section face (depth direction), the width and the shape of the electrodes of the second electrode group 305 are also set according to the specification of the pixel as with the first electrode group 304.

In this manner, without providing different photo-electric converter configurations to the image sensing pixel and the focus detecting pixel, it is possible to lay out the image sensing pixels and the focus detecting pixels without employing a complex electrical configuration, by providing the focus detecting pixel with the above-described shielding units and a configuration (in the above example, a configuration in which wiring widths are changed) and changing the method of adding signals of the photo-electric converters.

Figure 12:
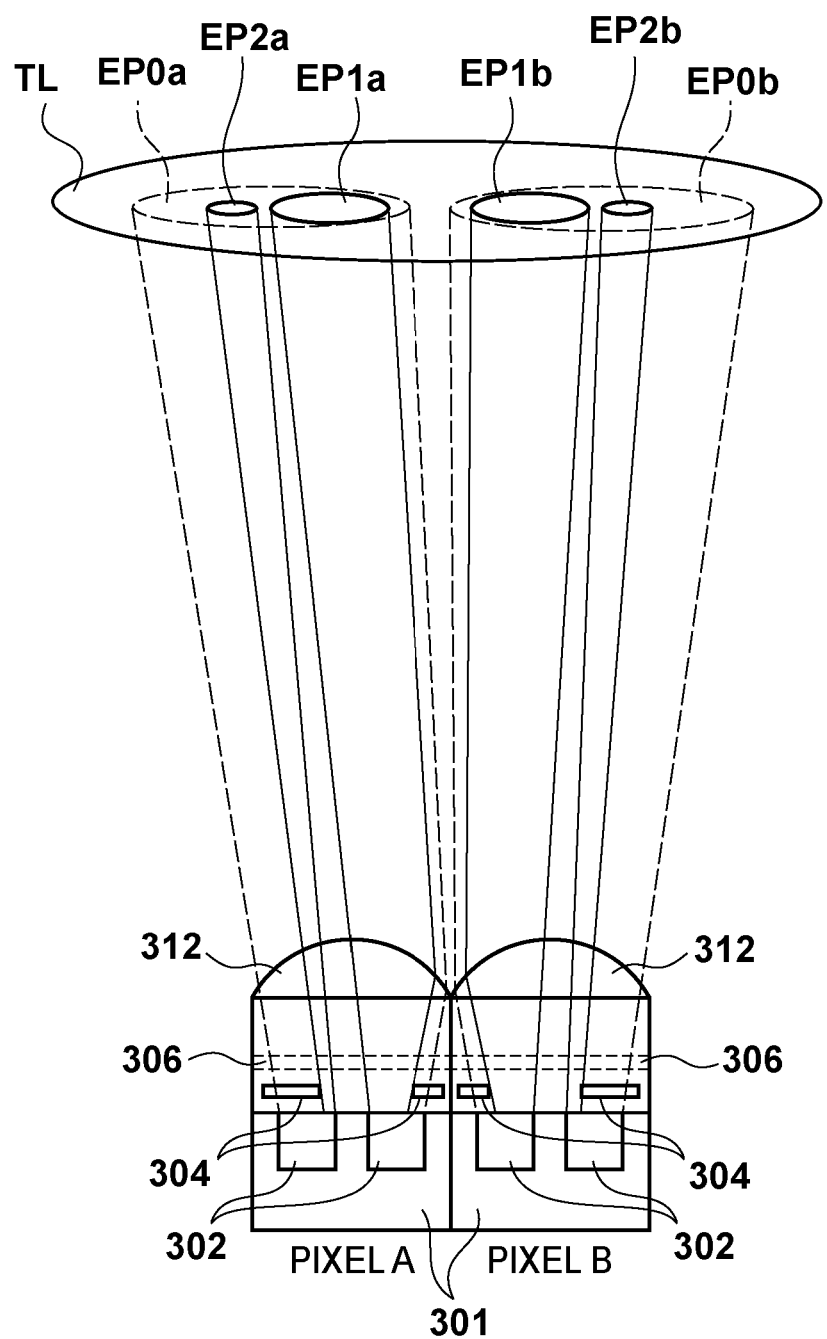
FIG. 12 is a diagram illustrating pupil projection of focus detecting pixels.

FIG. 12 is a diagram illustrating pupil projection of a phase-difference detecting pixel (focus detecting pixel) of the imaging optical system in one-dimensional direction (e.g., X direction).

In FIG. 12, phase difference of an object image is detected using, as a pair, two pixels (a) and (b) disposed in an orientation in which the left and right directions of the pixel configuration shown in FIG. 11 are inverted (the configuration is partially simplified).

The openings OP0 set in the configuration shown in FIG. 11 are projected as a pupil EP0a and a pupil EP0b of an exit pupil TL of the imaging optical system shown in FIG. 12 via the microlens 312.

On the other hand, in the focus detecting pixel, the widths of the openings in the shielding unit are restricted to OP1 and OP2 shown in FIG. 12. Therefore, in the regions of the pupils EP0a and EP0b, the pupil is divided such that the pupils corresponding to the opening OP1 are EP1a and EP1b in FIG. 12, and similarly, the pupils corresponding to the opening OP2 are EP2a and EP2b. The pixels (a) and (b) receive light fluxes that have passed through the regions of the pupils.

The pixel (a) and pixel (b) are regularly arrayed in the horizontal direction and/or the vertical direction as shown in FIG. 2 and FIG. 6. Thus, it is possible to detect the defocus amount of the object image by detecting an image shift amount between a first image signal generated by connecting output signals from a plurality of pixels (a) and a second image signal generated by connecting output signals from a plurality of pixels (b), that is, the phase difference.

In the present embodiment, each pixel includes a plurality of photo-electric converters over the entire surface of the solid-state image sensor, and since the photo-electric converters receive light through a single microlens, each photo-electric converter has different positional relation with the optical axis of the microlens. Therefore, the photo-electric converters receive light incident thereon for object images shifted from each other.

If signals of all the photo-electric converters within the pixel are added and used, although the resolution is reduced, the signals can be used as ordinary two-dimensional image data.

On the other hand, according to the pixel configuration of the present embodiment, among four photo-electric converters within a single pixel, output signals from photo-electric converters adjacent to each other in the horizontal or vertical direction are added, such that two image signals are output separately from the single pixel. In this manner, since parallax images of the object image reproduced from the respective image signals can be obtained as described above, three-dimensional image data can be generated by the method described below.

Method of Generating Three-dimensional Image Data

Figure 13A:
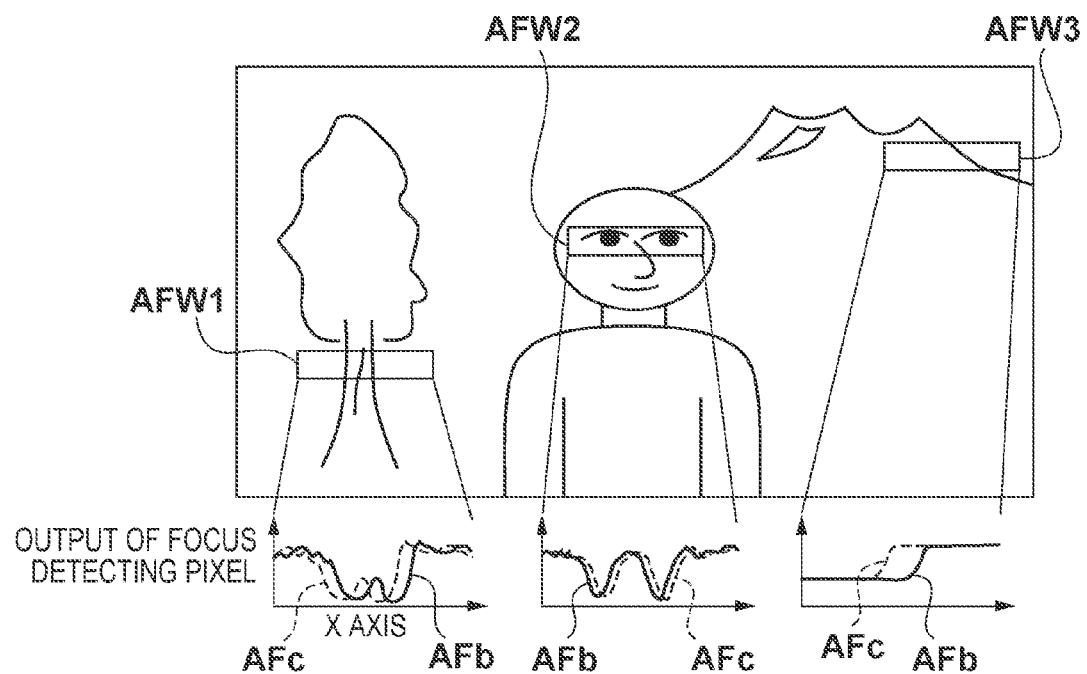
FIGS. 13A and 13B are diagrams illustrating the output signal at the time of focus detection and a defocus map.
Figure 13B:
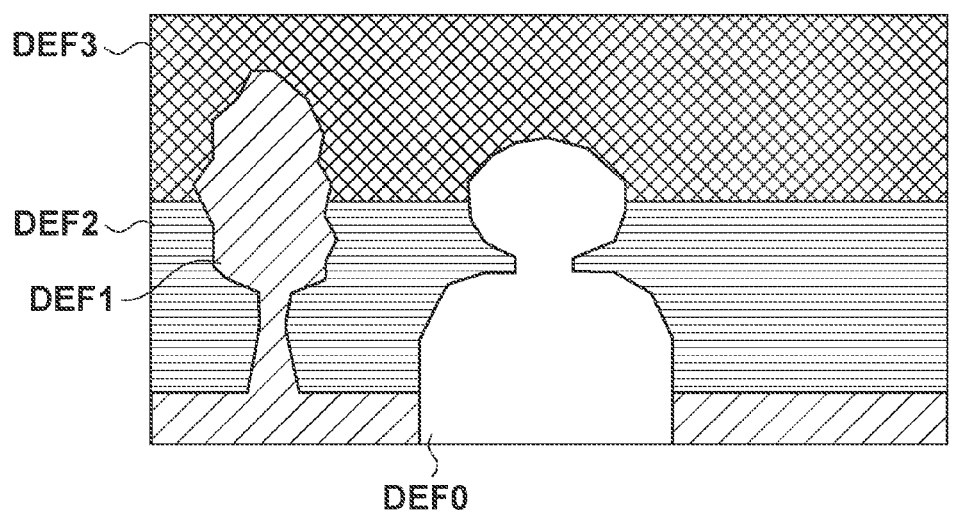

FIGS. 13A and 13B are diagrams illustrating an image and focus detection signals obtained during focus detection and a defocus map obtained from the focus detection result. In FIG. 13A, in the object image formed on an imaging plane, a person appears in the foreground in the central area, a tree appears in the middle ground on the left, and mountains appear in the background on the right. In the description provided below, a case will be described in which the signals from the third pixel 222 are used as the focus detection signals of FIGS. 13A and 13B.

In FIG. 13A, the face of a person is present at the center of the screen. If a face is detected by a known face recognition technique, a pair of focus detection signals AFb and AFc are obtained from the third pixels 222, centered on the face region. Also, for regions other than the face, focus detection regions are set across the entire image capturing screen at a prescribed pitch. In FIG. 13A, a focus detection region corresponding to the tree trunk on the left side and signals therefor, and a focus detection region corresponding to the mountains' ridge line in an upper right portion and signals therefor are also shown. Since two signals obtained for each focus detection region are laterally shifted from each other, the amount of such lateral shift is calculated by a known correlation operation, and further, the defocus amount is calculated by dividing the lateral shift amount by the base line length.

Thereafter, the focus lens of the imaging optical system is driven such that the defocus amount of the main object, which is the face region at the center in FIG. 13A, becomes zero, and focus detection is performed again.

In the focus adjustment process described above, defocus information for the entire image capturing screen, which is a so-called defocus map, is obtained, an example of which is shown in FIG. 13B. FIG. 13B shows an example in which the defocus amounts are organized and integrated as regions DEF0 to DEF3 based on a predetermined resolution, the defocus amount in the regions DEF0 to DEF3 increasing in this order.

Image Capturing Processing

Figure 14:
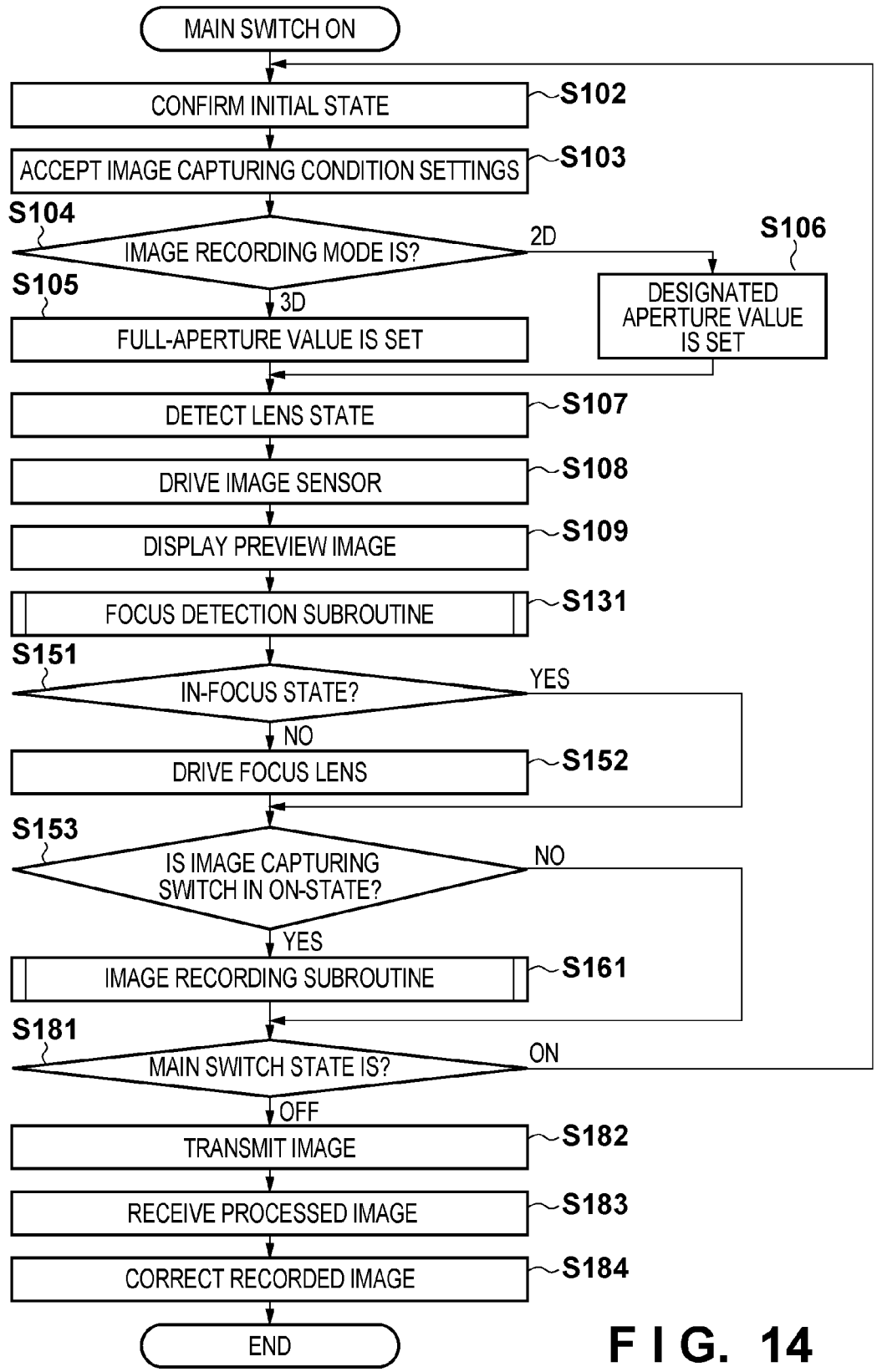
FIG. 14 is a flowchart illustrating image-capturing processing by the electronic camera of the present embodiment.

Referring to FIGS. 14 to 16, as well as FIG. 1 to FIGS. 13A and 13B, image capturing processing performed by the camera of the present embodiment will be described. The flowchart to be described below is executed by a CPU 121 expanding programs stored in a ROM in a work area of a RAM.

FIG. 14 is a flowchart illustrating the main routine of image capturing processing according to the first embodiment.

In FIG. 14, if an image capturer has turned on a power switch of the camera, in step S102, the CPU 121 confirms operations of actuators, the solid-state image sensor or the like in the camera, and executes image capturing preparation operation while performing initialization of memory contents, execution programs and the like.

In step S103, the CPU 121 performs a process of accepting image capturing condition settings. Specifically, the CPU 121 accepts setting operations by the image capturer for an exposure adjusting mode, a focus adjusting mode, an image recording mode (2D or 3D), image quality (the number of recording pixels, compression ratio, and the like), for example.

In step S104, the CPU 121 determines the image recording mode, and if a 3D image recording mode is set, the aperture value for image capturing is set to a full aperture value in step S105. Here, in the case of the 3D image recording mode, a pair of images is required to include appropriate parallax information. However, if the imaging optical system is set to a small aperture value for adjusting light quantity, parallax information is reduced. Accordingly, in the 3D image recording mode, the aperture is fixed to a full-aperture value, and the exposure amount is adjusted by the accumulation time of the solid-state image sensor.

On the other hand, if the 2D image recording mode is set in step S104, the CPU 121 performs control to set the aperture value to a designated value in step S106. Here, the designated value is an aperture value selected by the image capturer in the case of aperture-priority AE, and is a preset aperture value based on the exposure control program in the case of program AE.

In step S107, the CPU 121 detects the zoom state, the focus lens state and the aperture state of the imaging optical system, and reads out information such as the size of the exit pupils, the eye-point distance, and the like from the ROM.

In step S108, the CPU 121 starts imaging operations of the solid-state image sensor to read out pixel signals.

In step S109, the CPU 121 generates a reduced image for display from the pixel signals that have been read out, and displays the generated image on the display device 131 provided in the rear face of the camera body. Then, the image capturer decides the composition, or performs zoom operation, for example, while viewing this preview image.

In step S131, the CPU 121 executes focus detection processing to be described below.

In step S151, the CPU 121 determines whether or not the focus lens driving amount calculated in step S131 is less than or equal to a predetermined value. If the driving amount is less than or equal to the predetermined value, it is determined that the in-focus state is achieved, and the procedure moves to step S153. If the driving amount is greater than the predetermined value, the CPU 121 drives the focus lens in step S152.

In step S153, the CPU 121 determines whether or not an image-capturing switch has been turned on, and if the switch has not been turned on, the CPU 121 advances the procedures to step S181, and if the switch has been turned on, the CPU 121 executes image-recording processing to be described in step S161.

In step S181, the CPU 121 determines the state of a main switch, and if it is kept in the on-state, the procedure returns to step S102, and if it is in the off-state, the procedure moves to step S182.

In step S182, the CPU 121 transmits image data recorded in step S161 to a server computer via the Internet. Then, the server computer executes processing involving large-scale arithmetic operations, such as reconfiguration of the parallax information of 3D-image data, multiprecision arithmetic of the defocus map, or the like.

In step S183, the CPU 121 receives image data processed by the server computer.

In step S184, the CPU 121 performs correction such as addition of or replacement with a correction portion obtained by the processing performed by the server computer on the original image data recorded in step S161, and ends the image capturing processing.

Focus Detection Processing

FIG. 15 is a flowchart illustrating the focus detection processing subroutine in step S131 in FIG. 14. When the procedure moves from step S131 in FIG. 14 to the focus detection subroutine, in step S132, the CPU 121 identifies the object pattern from the preview image, and performs face image determination, contrast analysis of the entire image-capturing screen, or the like.

In step S133, the CPU 121 decides a main object to be focused on, based on the recognition result in step S132.

In step S134, the CPU 121 performs exit pupil calculation of the imaging optical system based on the lens information acquired in step S107. Specifically, the exit pupil size or the distance from the image surface are calculated, and next, vignetting calculation is performed for each image height.

In step S135, the CPU 121 selects, for each focus detection area, a pixel group receiving little vignetting influence based on the exit pupil information calculated in step S134.

In step S136, the CPU 121 generates a pair of images (two images) for correlation operation based on the output signals from the photo-electric converters of the selected pixel group. Note that the type of the pixel group selected here is not limited to one type, and a plurality of types of pixel groups are selected if they receive little vignetting influence.

In step S137, the CPU 121 performs, on the generated focus detection signal, so-called shading correction in which imbalance of light quantity due to vignetting is reduced. As a result, the difference in intensity between the two images is reduced, thereby improving focus detection accuracy.

In step S138, the CPU 121 performs correlation operation for calculating a lateral shift amount u of the two image subjected to shading correction.

In step S139, the CPU 121 determines reliability of the image shift detection result based on the matching degree of the two images calculated in the process of correlation operation performed in step S138, and does not use a value that is not reliable.

In step S140, based on the highly-reliable image shift amount that is obtained through steps S138 and S139 and the base line length of the pixel group used for focus detection, the CPU 121 calculates the defocus amount by dividing the image shift amount by the base line length.

In step S141, the CPU 121 creates a defocus map for the entire image-capturing region. Note that if the resolution of the defocus map (planar direction and depth direction) is increased, the arithmetic operation time also increases, and thus a resolution that does not substantially affect the video recording rate is set. If a detailed defocus map is necessary, such a map may be created by a high-specification server computer as illustrated in step S182 in FIG. 14.

In step S142, the CPU 121 calculates the driving amount of the focus lens based on the main object region decided in step S133 and the defocus map created in step S141. Thereafter, the procedure returns to the main routine shown in FIG. 14.

Image-Recording Processing

FIG. 16 is a flowchart illustrating the image-recording processing subroutine in step S161 in FIG. 14.

In FIG. 16, if the image-capturing switch has been turned on and the procedure has moved from step S161 in FIG. 14 to the image recording subroutine, the CPU 121 detects the orientation of the camera in step S162.

In step S163, the CPU 121 performs, based on the orientation detection result, addition of signals of photo-electric converters and pixel interpolation processing in accordance with the direction of gravity.

In step S164, the CPU 121 generates 3D image data in a predetermined format.

In step S165, the CPU 121 generates ordinary 2D image data obtained by erasing parallax information from the image data generated in step S164. For example, 2D image data that does not include parallax information can be obtained by adding pixel information pieces corresponding to the same coordinates in a pair of images.

In step S166, the CPU 121 performs predetermined compression processing on the image data generated in steps S164 and S165, and records the compressed image data in a flash memory 133.

In step S167, the CPU 121 records the defocus map created in step S141 in FIG. 14 in association with the image. Thereafter, the procedure returns to the main routine shown in FIG. 14.

As described above, according to the present embodiment, it is possible to lay out the image sensing pixels and the focus detecting pixels without employing a complex electrical configuration.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium). In such a case, the system or apparatus, and the recording medium where the program is stored, are included as being within the scope of the present invention While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-082189, filed Apr. 1, 2011, which is hereby incorporated by reference herein in its entirety.

What is claimed is:

1. A solid-state image sensor comprising:
a plurality of unit pixels, each unit pixel includes a microlens and a plurality of photo-electric converters arranged in an array below the microlens, wherein light passing through the microlens is incident on the plurality of photo-electric converters; and
a shielding layer that shields part of the photo-electric converters from incident light entering into the photo-electric converters, wherein the shielding layer corresponds to the microlens which is provided in a portion of the unit pixels, and the shielding layer of each unit pixel includes a plurality of openings, and each opening has different shape from another opening among the plurality of openings and spans part of a pair of photo-electric converters adjacent to each other among the plurality of photo-electric converters.

2. The sensor according to claim 1,
wherein one of first to fourth shielding layers is provided with each unit pixel,
a first opening and a second opening are formed in each of the first to fourth shielding layers,
the first and second openings of the first shielding layer are formed to be axis symmetrical with respect to an axis and the first and second openings of the second shielding layer are formed to be axis symmetrical with respect to the axis, and the first and second openings of the third shielding layer are formed to be axis symmetrical with respect to another axis and the first and second openings of the fourth shielding layer are formed to be axis symmetrical with respect to the other axis, the two axes being perpendicular to each other intersecting at a pixel center.

3. The sensor according to claim 1, wherein the shielding layer is formed by an electrode arranged for each unit pixel.

4. An image capturing apparatus, comprising:
the solid-state image sensor according to claim 1;
a focus detection unit configured to perform focus detection using signals from the unit pixels; and
a control unit configured to control an optical system to achieve an in-focus state according to a result of the detection by the focus detection unit.

5. The apparatus according to claim 4, wherein the focus detection unit performs focus detection in a phase-difference detection method using a pair of the unit pixels.

6. The apparatus according to claim 5, wherein the focus detection unit performs focus detection using a signal obtained by adding signals from the plurality of photo-electric converters in the unit pixels.

7. The apparatus according to claim 6, wherein the method of adding the signals from the plurality of photo-electric converters is changed.

8. The apparatus according to claim 4, wherein an image sensing pixel is configured such that sensed images of an object image have parallax.

9. The sensor according to claim 1, wherein the shielding layer shields part of all of the photo-electric converters.

* * * * *